(12) United States Patent
Sandhu et al.

(10) Patent No.: US 8,476,140 B2
(45) Date of Patent: Jul. 2, 2013

(54) HIGH-PERFORMANCE DIODE DEVICE STRUCTURE AND MATERIALS USED FOR THE SAME

(75) Inventors: Gurtej Sandhu, Boise, ID (US); Bhaskar Srinivasan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/352,833

(22) Filed: Jan. 18, 2012

(65) Prior Publication Data

US 2012/0112185 A1 May 10, 2012

Related U.S. Application Data

(62) Division of application No. 12/580,013, filed on Oct. 15, 2009, now Pat. No. 8,120,134.

(51) Int. Cl.
*H01L 21/8222* (2006.01)
*H01L 21/20* (2006.01)

(52) U.S. Cl.
USPC ............... 438/328; 438/380; 257/E21.352; 257/E21.358

(58) Field of Classification Search
USPC ............... 438/237, 328, 380; 257/E21.352, 257/E21.358
See application file for complete search history.

(56) References Cited

U.S. PATENT DOCUMENTS

| | | | |
|---|---|---|---|
| 3,822,381 A * | 7/1974 | Scott | 250/208.2 |
| 4,839,219 A | 6/1989 | Uekita et al. | |
| 5,614,727 A | 3/1997 | Mauri et al. | |
| 5,625,587 A * | 4/1997 | Peng et al. | 365/145 |
| 6,087,702 A | 7/2000 | Chang et al. | |
| 6,229,670 B1 * | 5/2001 | Kuo et al. | 360/135 |
| 7,009,694 B2 | 3/2006 | Hart et al. | |
| 7,361,406 B2 | 4/2008 | Wang | |
| 2005/0191776 A1 | 9/2005 | Lamansky et al. | |
| 2005/0265072 A1 | 12/2005 | Hart et al. | |
| 2008/0105870 A1 | 5/2008 | Yu et al. | |
| 2008/0272363 A1 | 11/2008 | Mouli | |
| 2008/0316809 A1 | 12/2008 | Herner | |
| 2009/0072246 A1 | 3/2009 | Genrikh et al. | |
| 2012/0238047 A1 * | 9/2012 | Bawendi et al. | 438/46 |

OTHER PUBLICATIONS

Z.G. Sheng, et al., "Transport Properties and Backward Diode-like Behavior in Manganite-Based P-I-N Junctions," J. Phys. D: Appl. Phys. 41 1350089 (Jun. 19, 2008).

Myoung-Jae Lee, et al., "Low-Temperature-Grown Transition Metal Oxide Based Storage Materials and Oxide Transistors for High-Density Non-volatile Memory", (Research paper), http://www3.interscience.wiley.com/journal/121544710/abstract, Published on-line Dec. 4, 2008.

* cited by examiner

*Primary Examiner* — Ngan Ngo
(74) *Attorney, Agent, or Firm* — Dickstein Shapiro LLP

(57) ABSTRACT

A diode and memory device including the diode, where the diode includes a conductive portion and another portion formed of a first material that has characteristics allowing a first decrease in a resistivity of the material upon application of a voltage to the material, thereby allowing current to flow there through, and has further characteristics allowing a second decrease in the resistivity of the first material in response to an increase in temperature of the first material.

20 Claims, 7 Drawing Sheets

US 8,476,140 B2

HIGH-PERFORMANCE DIODE DEVICE STRUCTURE AND MATERIALS USED FOR THE SAME

CROSS-REFERENCE TO RELATED APPLICATIONS

This application is a divisional of U.S. patent application Ser. No. 12/580,013, filed on Oct. 15, 2009, the subject matter of which is incorporated in its entirety by reference herein.

FIELD OF THE INVENTION

Disclosed embodiments relate generally to diode devices and more particularly to high-performance diode devices exhibiting favorable forward current characteristics.

BACKGROUND

Diodes are one of the most fundamental semiconductor elements or components. A diode usually allows current flow in one direction but not in another. A diode is constructed as a two-region device separated by a junction; however, various types of diodes which have different junction structures also exist. Two examples of common diode types include silicon-based doped p-n junction diodes and Schottky diodes.

Diodes have many applications and are frequently used in, for example, memory devices, logic circuits or solar cells, or may function as LEDs (light emitting diodes). Diode devices with high ON current and high ON/OFF current ratio (resulting in low leakage current) also have many applications, such as for example, as a select device in a memory element. Silicon-based junction diodes may provide high ON current and high ON/OFF current ratios, but the manufacturing process of conventional silicon-based junction diodes is much more complicated and requires higher processing temperatures than, for example, a metal-insulator-metal (MIM) diode system. Unfortunately, known MIM diode systems are not able to meet the high forward current requirements of many applications.

Accordingly, there is a need and desire for a diode device that exhibits favorable forward current characteristics while also being easily manufactured at low temperatures (<500° C.).

DETAILED DESCRIPTION

In the following detailed description, reference is made to the accompanying drawings which form a part hereof, and in which are shown by way of illustration specific embodiments that may be practiced. It should be understood that like reference numbers represent like elements throughout the drawings. These example embodiments are described in sufficient detail to enable those skilled in the art to practice them. It is to be understood that other embodiments may be utilized, and that structural, material, and electrical changes may be made, only some of which are discussed in detail below.

Disclosed embodiments relate to a diode device and methods of constructing and operating the same, wherein the diode exhibits high ON current as well as a high ON/OFF ratio. Disclosed embodiments achieve these characteristics by using a combination of the properties of low electric field turn-on and joule assisted self heating to build high forward currents at relatively low voltage values. The embodiments utilize a material that has a first characteristic allowing a first decrease in a resistivity of the material upon application of a low voltage and a second characteristic allowing a second decrease in the resistivity of the material in response to an increase in temperature of the material.

Figure 1:
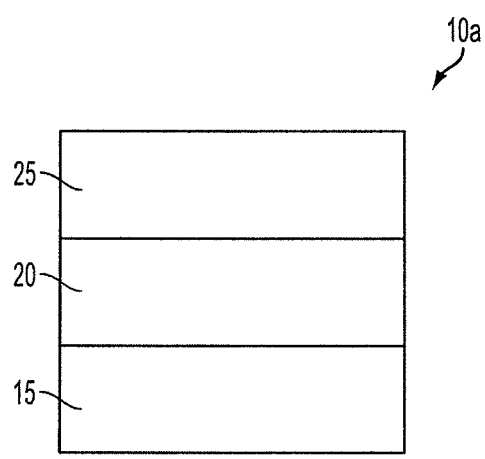
FIG. 1 is a cross-sectional view of a diode according to a disclosed embodiment.
Figure 2:
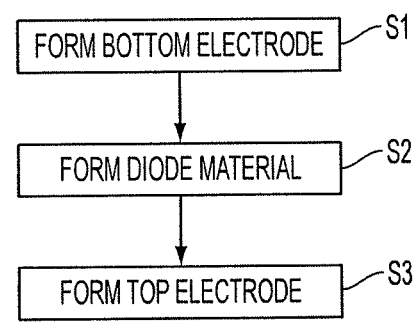
FIG. 2 is a flowchart illustrating a manufacturing method for a diode according to FIG. 1.

One disclosed embodiment is illustrated in FIG. 1. Diode 10a includes conductive materials 15 and 25 on either side of material 20 (described below in more detail). Conductive materials 15 and 25 may also be referred to as diode electrodes. Referring to FIG. 2, the example embodiment of FIG. 1 may be fabricated as follows. Conductive material 15 may be formed over any suitable substrate base (not shown), at step S1. Conductive material 15 may be patterned as desired by utilizing photolithographic processing and one or more etches, or by any other suitable patterning technique. Material 20 may then be formed over conductive material 15, at step S2. In some embodiments, material 20 may be deposited on material 15 and may then be patterned using photolithographic processing and one or more etches, or by any other suitable patterning technique. Material 20 may be deposited with any suitable methodology, including, for example, atomic layer deposition (ALD) methods or plasma vapor deposition (PVD) methods, such as sputtering and evaporation, thermal deposition, chemical vapor deposition (CVD) methods, plasma-enhanced (PECVD) methods, and photo-organic deposition (PODM). Conductive material 25 may then be deposited over material 20, at step S3, using one or more of the techniques described above in relation to material 20, or any other method. Each of conductive materials 15 and 25 and the material 20 may be formed as thin-films. Alternatively, diode 10a may be formed by layering all of the materials 15, 20 and 25 and then etching them all at once to form a diode stack.

The above-described method is much simpler than the complicated steps required for forming, for example, a conventional silicon-based junction diode. Additionally, the manufacturing process of conventional silicon-based junction diodes requires higher processing temperatures than those of the disclose embodiments, which have a thermal budget of less than 500° C.

Conductive materials 15 and 25 may include any suitable conductive material, such as, for example, one or more of various metals, such as tantalum, platinum, tungsten, aluminum, copper, gold, nickel, titanium, molybdenum, etc., metal-containing compositions, such as metal nitrides, metal silicides (e.g., tungsten silicate or tantalum silicide, etc.), and conductively-doped semiconductor materials (for instance, conductively-doped silicon). Additionally, conductive materials 15 and 25 may be formed of the same material or of different materials.

Material 20 is selected such that under initial programming (off) conditions, current is not conducted from material 25 to material 15, but that under appropriate operating conditions, the material 20 undergoes a transition and becomes conductive. Appropriate materials selected for material 20, in accordance with disclosed embodiments, are those that operate in a fashion similar to the operation illustrated in the I-V curve of FIG. 3. There are two separate phenomena at work in conjunction with each other to allow the particular curve profile shown in FIG. 3 to be achieved. These phenomena are low electric field assisted metal-insulator transition and Joule heating assisted current increase.

Low electric field assisted metal-insulator transition occurs in materials whose resistance is changed when a voltage is applied to the material. While the voltage remains below a threshold voltage value ($V_{th}$), material 20 has a high resistivity. When the voltage reaches the threshold voltage value ($V_{th}$), however, material 20 quickly changes to a low resistivity. Joule heating assisted current increase occurs when, due to the temperature increase of the material resulting from the heat generated by the current flowing through the material, the resistivity of the material suddenly decreases, allowing a corresponding sudden increase in current flow.

The disclosed embodiments select materials for material 20 which embody both of these phenomena. As illustrated in the I-V curve of FIG. 3, an appropriate material for material 20 will have a low threshold voltage ($V_{th}$) and allow high forward current (A) to the diode at relatively low voltages. As voltage V is applied across diode 10a, only leakage current is present until the threshold voltage $V_{th}$ is reached. At that point, a steep increase 30 in the current occurs. This increase is due the low electric field assisted metal-insulator transition effect. Small electric fields (few kV/cm) across the diode structure 10a will induce an insulator-metal transition in material 20, causing the abrupt increase 30 in current seen at the threshold voltage $V_{th}$. In disclosed embodiments, the threshold voltage preferably occurs at a voltage value of approximately 0.5V to approximately 1.5V and this is preferably observed at room temperature.

As voltage continues to be applied, the temperature of material 20 will increase, due to the resistance of the material to the current flow. Once the material reaches a threshold temperature, the Joule heating assisted current increase will be seen, such as that shown in the steep increase 35 in the current flow. In disclosed embodiments, the Joule heating assisted current increase preferably occurs at voltage values of approximately 4.0V or below (e.g., between approximately 1.5V and approximately 4.0V).

Figure 3:
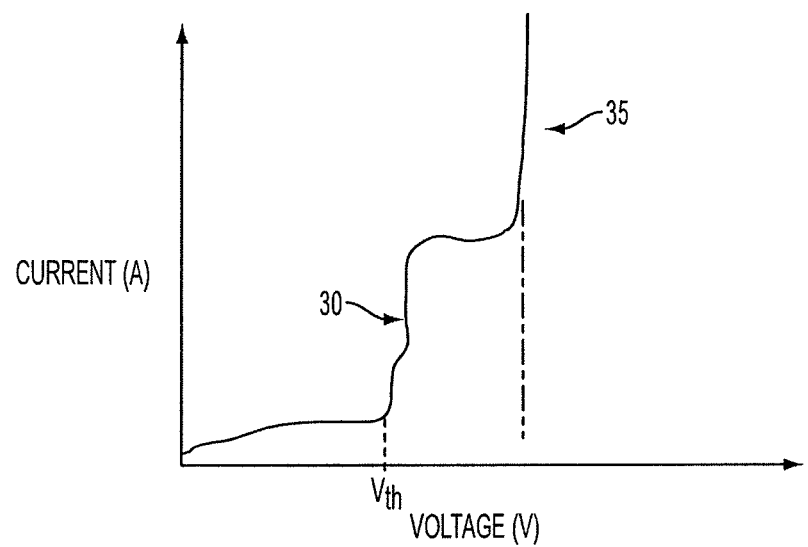
FIG. 3 is an I-V curve of a diode according to a disclosed embodiment.

FIG. 3 should not be taken as a precise representation of an I-V curve according to disclosed embodiments but should only be taken as an approximation of a representative typical temperature profile according to one the disclosed embodiments. FIG. 3 should not be interpreted as a limitation on the scope of all embodiments.

According to disclosed embodiments, this combination of multiple steep current increases allows very high forward current drive at a relatively low voltage and a relatively low current at voltages below the threshold voltage, resulting in a high performance diode device having an ultra high forward current density (e.g., between approximately $1\times10^6$ A/cm$^2$ to approximately $1\times10^8$ A/cm$^2$, and preferably on the order of $1\times10^7$ A/cm$^2$) and a very high ON/OFF current ratio. Additionally, the I-V curves of the diode of the disclosed embodiments are non-ohmic and the change in the resistivity over the curve can be several orders of magnitude ($>10^5$).

In order to achieve such a beneficial result from the low electric field assisted metal-insulator transition and Joule heating assisted current increase, material 20 must be chosen to be compatible with each of these effects. Some materials found to be particularly suited for such an application include, for example, vanadium oxides, particularly $VO_2$, aluminum-doped vanadium oxides, titanium-doped vanadium oxides, or rare earth manganates ($Ln_{(1-x)}A_xMnO_3$, Ln=rare earth, A=alkaline earth), particularly $Sr_{(1-x)}La_xMnO_3$, where $0.0 \leq x \leq 0.4$.

Figure 4:
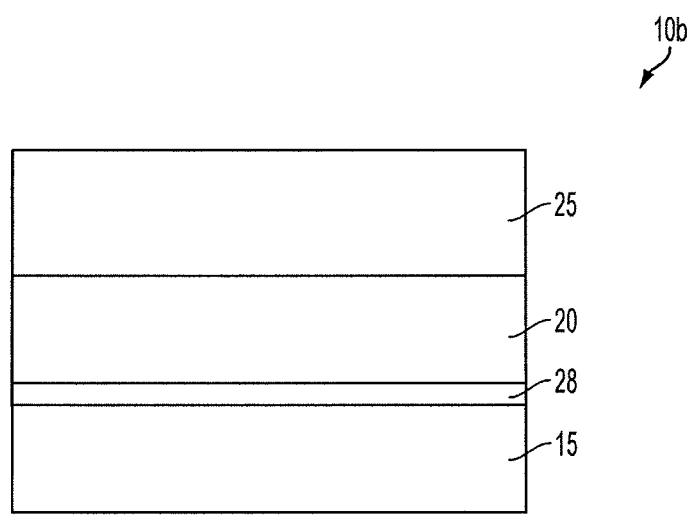
FIG. 4 is a cross-sectional view of a diode according to another disclosed embodiment.

In another embodiment, a heating element may additionally be included in the diode in order to assist with the temperature increase, thus more easily reaching the temperature at which the current increases for the second time. This is illustrated in the diode 10b of FIG. 4, which further includes heating element 28 between electrode 15 and material 20. Alternatively, the heating element 28 may be positioned between material 20 and electrode 25 or two heating elements 28 may be included, one positioned between electrode 15 and material 20 and the other positioned between material 20 and electrode 25. Heating element 28 is formed of any material having a suitable resistance to cause the desired amount of heating when current flows through the material while still allowing current flow through the diode, such as for example metal oxides. Heating element 28 may also be, for example, a metal heating coil. Other elements of FIG. 4 are the same as described with respect to FIG. 1.

Diodes of the disclosed embodiments may be used in any application requiring a diode, and in particular one in which high forward current density is desired. Examples include memory applications, logic circuits, solar cells, or LEDs. One example application particularly suited to the diodes of the disclosed embodiments is a select device for a cross point memory device 100, as illustrated for example in FIGS. 5A and 5B.

Figure 5A:
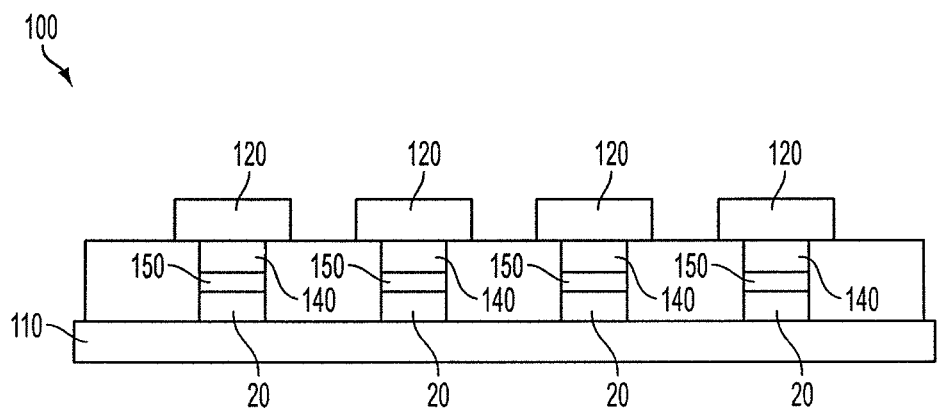
FIG. 5A illustrates a cross-sectional view of a cross point memory device including a diode according to a disclosed embodiment.
Figure 5B:
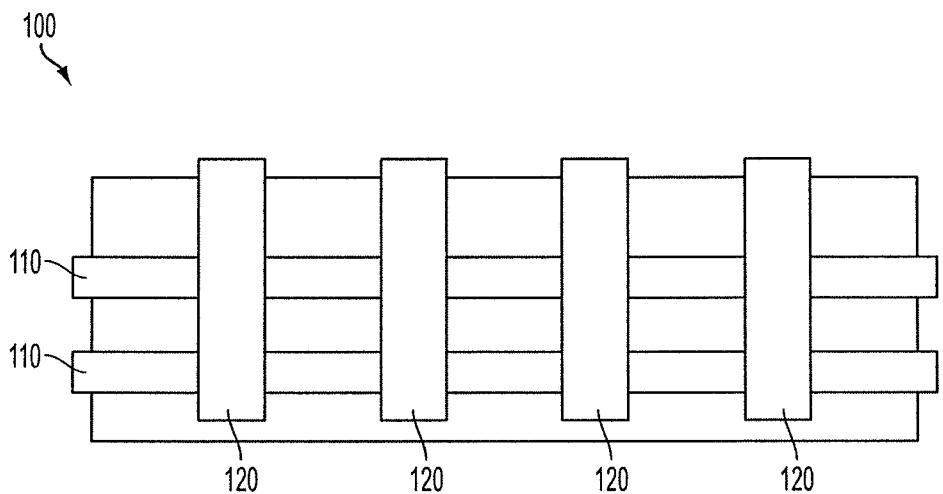
FIG. 5B illustrates a top view of the cross point memory device of FIG. 5A.
Figure 6:
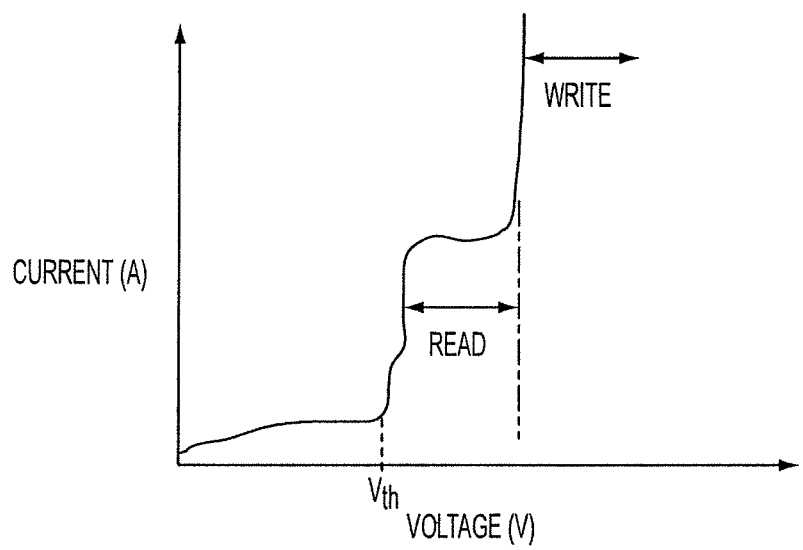
FIG. 6 is an I-V curve of a diode included in a memory device according to a disclosed embodiment.

FIG. 5A illustrates a cross-sectional view of a cross point memory device 100 including a diode 10a (FIG. 1). Alternatively, diode 10b (FIG. 4) may be used in place of diode 10a. FIG. 5B illustrates a top view of the cross point memory device 100. The access lines 110, for example word lines, and data/sense lines 120, for example bit lines, of the cross point memory device 100 are connected at their intersections by a diode 10a of the disclosed embodiments. In the cross point memory device application of the diode 10a of the disclosed embodiments, word line 110 operates as the diode electrode 15 (FIG. 1) and electrode 150 operates as diode electrode 25 (FIG. 1). Memory element 140 is present above electrode 150 and is accessed via the diode 10a. As illustrated in FIG. 6, after the first increase in current, the memory element 140 may be "read" and after the second increase in current, the "write" function may be performed.

Figure 7:
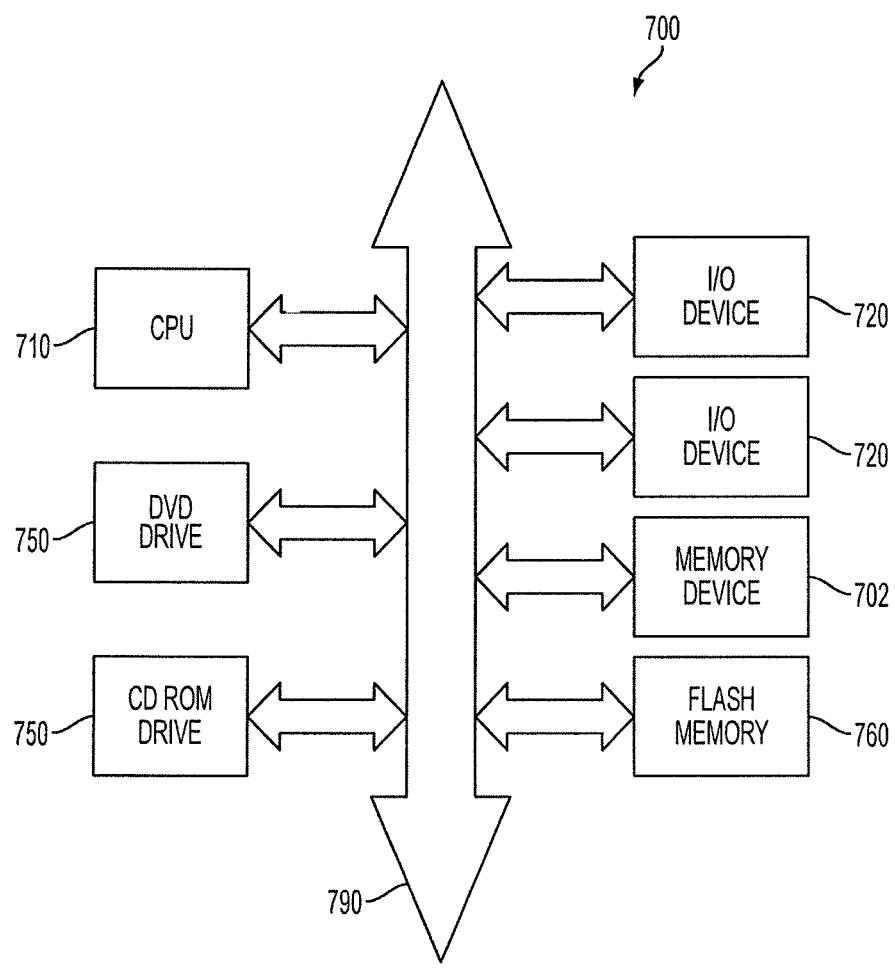
FIG. 7 illustrates a processing system, utilizing a diode and/or memory device according to a disclosed embodiment.

The diode 10a, 10b and/or memory array 100 may be fabricated as part of an integrated circuit. The corresponding integrated circuit may be utilized in a processor system. For example, FIG. 7 illustrates a simplified processor system 700, which includes a memory device 702 which may include memory array 100 (and diode 10a, 10b) in accordance with the above described embodiments. A processor system, such as a computer system, generally comprises a central processing unit (CPU) 710, such as a microprocessor, a digital signal processor, or other programmable digital logic devices, which communicates with input/output (I/O) devices 720 over a bus 790. The memory device 702 communicates with the CPU 710 over bus 790 typically through a memory controller. The processor system 700 may also include flash memory 760.

In the case of a computer system, the processor system 700 may include peripheral devices such as removable media devices 750 (e.g., CD-ROM drive or DVD drive) which communicate with CPU 710 over the bus 790. Memory device 702 can be constructed as an integrated circuit, which includes one or more memory arrays 100 and/or diodes 10a, 10b. If desired, the memory device 702 may be combined with the processor, for example CPU 710, as a single integrated circuit.

The above description and drawings should only be considered illustrative of exemplary embodiments that achieve the features and advantages described herein. Modification and substitutions to specific process conditions and structures can be made. Accordingly, the claimed invention is not to be considered as being limited by the foregoing description and drawings, but is only limited by the scope of the appended claims.

What is claimed as new and desired to be protected by Letters Patent of the United States is:

1. A method of forming a diode comprising:
    forming a layer of a first conductive material;
    forming a heating element over the first conductive material;
    forming a layer of a diode material over the heating element; and
    forming a layer of a second conductive material over the diode material,
    wherein the diode material is selected from the group consisting of a vanadium oxide, an aluminum-doped vanadium oxide, a titanium-doped vanadium oxide and a rare earth manganate represented by the formula $Ln_{(1-x)}A_xMnO_3$, wherein Ln represents a rare earth element and A represents an alkaline earth element.

2. The method of claim 1, wherein the diode material is $La_{(1-x)}SR_xMnO_3$, where $0.6 \leqq x \leqq 1.0$.

3. The method device of claim 1, wherein the diode material is $VO_2$.

4. A method of forming a diode comprising:
    forming a first conductive material;
    forming a heating element over the first conductive material;
    forming a diode material over the heating element; and
    forming a second conductive material over the diode material,
    wherein the diode material has characteristics allowing a first decrease in a resistivity of the diode material upon application of a first voltage to the diode material, thereby allowing current to flow through the diode material, and having further characteristics allowing a second decrease in the resistivity of the diode material in response to a temperature increase of the diode material by joule heating.

5. The method of claim 4, wherein the temperature increase of the diode material is due to heat generated by current flowing through the diode material.

6. The method of claim 4, wherein the temperature increase of the diode material is due to heat generated by the heating element.

7. The method of claim 4, wherein the diode material comprises a vanadium oxide.

8. The method of claim 4, wherein the diode material comprises $VO_2$.

9. The method of claim 4, wherein the diode material comprises an aluminum-doped vanadium oxide.

10. The method of claim 4, wherein the diode material comprises a rare earth manganate represented by the formula $Ln_{(1-x)}A_xMnO_3$, wherein Ln represents a rare earth element and A represents an alkaline earth element.

11. The method of claim 4, wherein the diode material comprises $La_{(1-x)}Sr_xMnO_3$, where $0.6 \leqq x \leqq 1.0$.

12. The method of claim 4, wherein the first decrease in the resistivity of the diode material occurs at a voltage of approximately 0.5V to approximately 1.5V.

13. The method of claim 4, wherein the second decrease in the resistivity of the diode material occurs at voltage of approximately 1.5V to approximately 4.0V.

14. A method of forming a memory device comprising:
    forming a memory element; and
    forming a diode for accessing the memory element,
    wherein forming the diode comprises:
        forming a first conductive material;
        forming a diode material over the first conductive material;
        forming a heating element over the diode material; and
        forming a second conductive material over the heating element,
    wherein the diode material is selected from the group consisting of a vanadium oxide, an aluminum-doped vanadium oxide, a titanium-doped vanadium oxide and a rare earth manganate represented by the formula $Ln_{(1-x)}A_xMnO_3$, wherein Ln represents a rare earth element and A represents an alkaline earth element.

15. The method of claim 14, further comprising forming a plurality of memory elements and a plurality of corresponding diodes for accessing respective memory elements, wherein each diode is a select device for a corresponding memory element, and wherein the memory device is a cross-point memory.

16. The method of claim 14, wherein the diode material has characteristics allowing a first decrease in a resistivity of the diode material upon application of a first voltage to the diode material, thereby allowing current to flow through the diode material, and having further characteristics allowing a second decrease in the resistivity of the diode material in response to a temperature increase of the diode material by joule heating.

17. The method of claim 16, the temperature increase causing the second decrease in the resistivity of the diode material is due to at least one of heat generated by current flowing through the diode material and heat generated by the heating element.

18. The method of claim 14, wherein the diode material is $VO_2$.

19. The method of claim 14, wherein the diode material is an aluminum-Doped vanadium oxide.

20. The method of claim 14, wherein the diode material is $La_{(1-x)}Sr_xMnO_3$, where $0.6 \leqq x \leqq 1.0$.

* * * * *

UNITED STATES PATENT AND TRADEMARK OFFICE
CERTIFICATE OF CORRECTION

PATENT NO. : 8,476,140 B2  Page 1 of 1
APPLICATION NO. : 13/352833
DATED : July 2, 2013
INVENTOR(S) : Gurtej Sandhu et al.

It is certified that error appears in the above-identified patent and that said Letters Patent is hereby corrected as shown below:

In the Claims:

In column 5, line 30, in Claim 2, delete "$0.6\underline{\leq}x\underline{\leq}1.0$." and insert -- $0.6\leq x\leq 1.0$. --, therefor.

In column 5, line 31, in Claim 3, delete "method device" and insert -- method --, therefor.

In column 6, line 8, in Claim 11, delete "$0.6\underline{\leq}x\underline{\leq}1.0$." and insert -- $0.6\leq x\leq 1.0$. --, therefor.

In column 6, line 54, in Claim 19, delete "aluminium-Doped" and insert -- aluminium-doped --, therefor.

In column 6, line 56, in Claim 20, delete "$0.6\underline{\leq}x\underline{\leq}1.0$." and insert -- $0.6\leq x\leq 1.0$. --, therefor.

Signed and Sealed this
Seventeenth Day of September, 2013

Teresa Stanek Rea
*Deputy Director of the United States Patent and Trademark Office*